(12) United States Patent
Collins et al.

(10) Patent No.: US 11,462,521 B2
(45) Date of Patent: Oct. 4, 2022

(54) MULTILEVEL DIE COMPLEX WITH INTEGRATED DISCRETE PASSIVE COMPONENTS

(71) Applicant: Intel Corporation, Santa Clara, CA (US)

(72) Inventors: Andrew P. Collins, Chandler, AZ (US); Jianyong Xie, Chandler, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 898 days.

(21) Appl. No.: 16/022,677

(22) Filed: Jun. 28, 2018

(65) Prior Publication Data

US 2020/0006302 A1  Jan. 2, 2020

(51) Int. Cl.
*H01L 25/16* (2006.01)
*H01L 23/48* (2006.01)
*H01L 23/64* (2006.01)
*H01L 23/36* (2006.01)

(52) U.S. Cl.
CPC ............ *H01L 25/16* (2013.01); *H01L 23/481* (2013.01); *H01L 23/642* (2013.01); *H01L 23/645* (2013.01)

(58) Field of Classification Search
CPC ...... H01L 25/16; H01L 23/481; H01L 23/642; H01L 23/645
See application file for complete search history.

(56) References Cited

U.S. PATENT DOCUMENTS

| 9,129,935 B1* | 9/2015 | Chandrasekar ......... H01L 23/50 |
| 2016/0190113 A1* | 6/2016 | Sharan .................... H01L 25/16 |
| | | 257/531 |
| 2017/0263518 A1* | 9/2017 | Yu ........................... H01L 24/16 |
| 2017/0374733 A1* | 12/2017 | Itakura .................. H01L 25/105 |

* cited by examiner

*Primary Examiner* — Herve-Louis Y Assouman
(74) *Attorney, Agent, or Firm* — Schwabe, Williamson & Wyatt P.C.

(57) ABSTRACT

A package is disclosed. The package includes a base die. The base die includes voltage regulating circuitry and input and output (I/O) circuitry. The I/O circuitry surrounds the voltage regulating circuitry. The package also includes a top set of dies. The top set of dies includes a plurality of dies that include logic circuitry and a plurality of dies that include passive components. The plurality of dies that include passive components surround the plurality of dies that include logic circuitry. The plurality of dies that includes passive components is coupled to the logic circuitry and to the voltage regulating circuitry.

20 Claims, 7 Drawing Sheets

MULTILEVEL DIE COMPLEX WITH INTEGRATED DISCRETE PASSIVE COMPONENTS

TECHNICAL FIELD

Embodiments of the disclosure pertain to multilevel die complexes and, in particular, multilevel die complexes with integrated passive components.

BACKGROUND

In microelectronics, some integrated circuits (ICs) are manufactured by stacking silicon wafers or dies, and interconnecting them vertically. The dies can be connected using through-silicon vias (TSVs) or Cu—Cu connections, so that they behave as a single device. In this manner, they can achieve performance improvements at reduced power and with a smaller footprint than can other approaches. Consequently, vertically stacked integrated circuits (ICs) or circuitry has emerged as a viable solution for meeting electronic device requirements such as higher performance, increased functionality, lower power consumption, and a smaller footprint.

DESCRIPTION OF THE EMBODIMENTS

Figure 1:
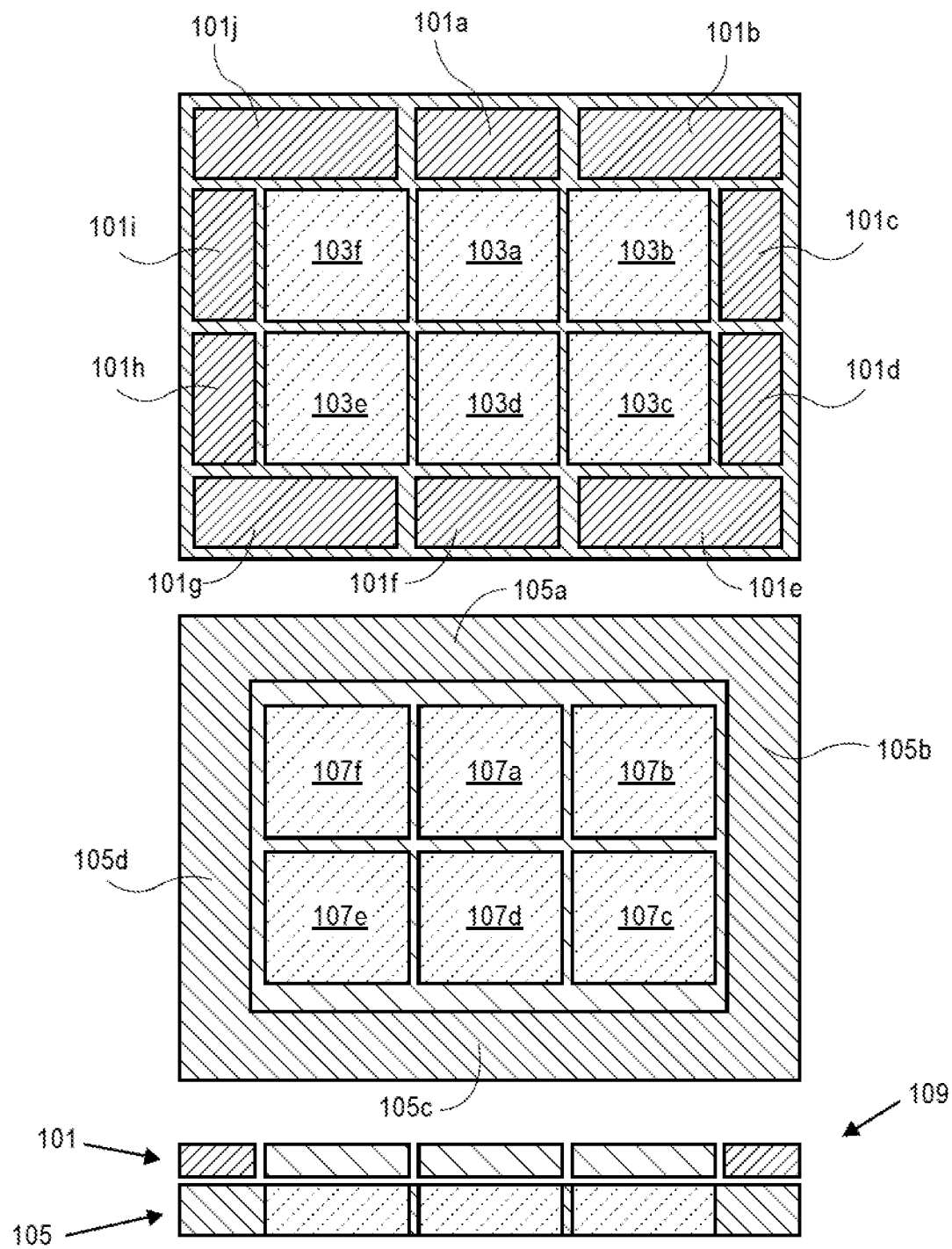
FIG. 1 is an illustration of a die package floor plan according to a previous approach.

Multilevel die complexes with integrated passive components are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In a previous approach, dummy die are positioned above components on a base die to allow for a direct path from the thermal hot spots to the integrated heat spreader (IHS) for heat dissipation. The dummy die also provide mechanical stress stability to the die complex and helps to ensure a consistent die underfill of the top die complex. However, these dummy die do not provide electrical value added.

A process and device that overcomes the shortcomings of previous approaches is disclosed herein. As part of the disclosed process, integrated silicon or organic based discrete passive components can be placed on top of a base die or dies where no active silicon dies are used in previous approaches. These passive components can include but are not limited to inductors, on-die capacitors (e.g., metal-insulator-metal capacitors), filters or a combination of these components. In an embodiment, an alternative on-die voltage regulator power delivery path can be provided, with air-core inductor organic substrates and/or magnetic inductor array (MIA), or silicon-based inductors positioned on top of the base die. In addition, embodiments supplement base die high speed input/output (I/O) with additional decoupling capacitance using silicon based on-die capacitors or discrete capacitors. In an embodiment, passive components that are required for high-speed signaling and radio frequency (RF)/digital blocks can be integrated by patterning inductors on organic or silicon based substrates.

FIG. 1 is an illustration of a die package floor plan according to a previous approach. FIG. 1 shows dummy thermal die 101a-101j, chiplets 103a-103f, high speed I/O interface die 105a-105d, and on-die voltage regulator 107a-107f.

Referring to FIG. 1, dummy thermal die 101a-101j are positioned above the periphery of the top surface of a base die layer 105. The dummy thermal die 101a-101j are used to absorb excessive or unwanted heat. The dummy thermal die 101a-101j includes dummy silicon that is positioned above the high speed I/O interface die 105a-105d that form the periphery of the base die layer 105. The dummy thermal die 101a-101j provide a direct path from thermal hot spots associated with the high speed I/O 105a-105d to the IHS thermal energy removal solution. In addition, the dummy thermal die 101-101j provide mechanical stress stability to the die complex (the set of die that are part of the top and bottom die layers of the multilayer package) and helps to ensure a consistent die underfill of the top die complex (the group of die located above the base die layer). The dummy thermal die 101a-101j do not include any electrical circuitry or component. Thus, the dummy thermal die 101a-101j do not operate to provide any electrical functionality (electrical added value) in the die complex.

The chiplets 103a-103f are small sized semiconductor chips that contain electrical circuitry. The chiplets 103a-103f are organized in a plurality of rows and columns and are surrounded by the dummy thermal die 101a-101j. The chiplets 103a-103f can include a variety of device types. In some approaches, the chiplets 103a-103f can include CPUs. In other approaches, the chiplets 103a-103f can include other devices.

The high speed I/O interface locations on the base die 105a-105d include high speed input and output circuitry that receives data for input to the die of the die complex and facilitates the transmission of data that is output from the die of the base die. The high speed I/O interfaces 105a-105d are positioned in the periphery of the base die 105.

The on-die voltage regulator locations on the base die 107a-107f include fully integrated voltage regulators. In an embodiment, the on-die voltage regulator locations on the base die 107a-107f can be independently programmable for optimal operation and to minimize power consumption. The on-die voltage regulator locations on the base die 107a-107f are arranged in the base die layer 105 in a plurality of rows and columns that are located directly underneath the chiplets 103a-103f of the top die layer 101 of the multilevel die complex.

Referring again to FIG. 1, a cross-sectional view 109 of the die complex is shown at bottom. The cross-sectional view 109 shows the position of the dummy thermal die (e.g., 101a-101j) of the top die layer 101 above the high speed I/O interface locations (e.g., 105a-105d) of the base die layer 105 and the chiplets (e.g., 103a-103f) of the top die layer 101 above the on-die voltage regulator locations on the base die (e.g., 107a-107f) of the base die layer 105.

Figure 2:
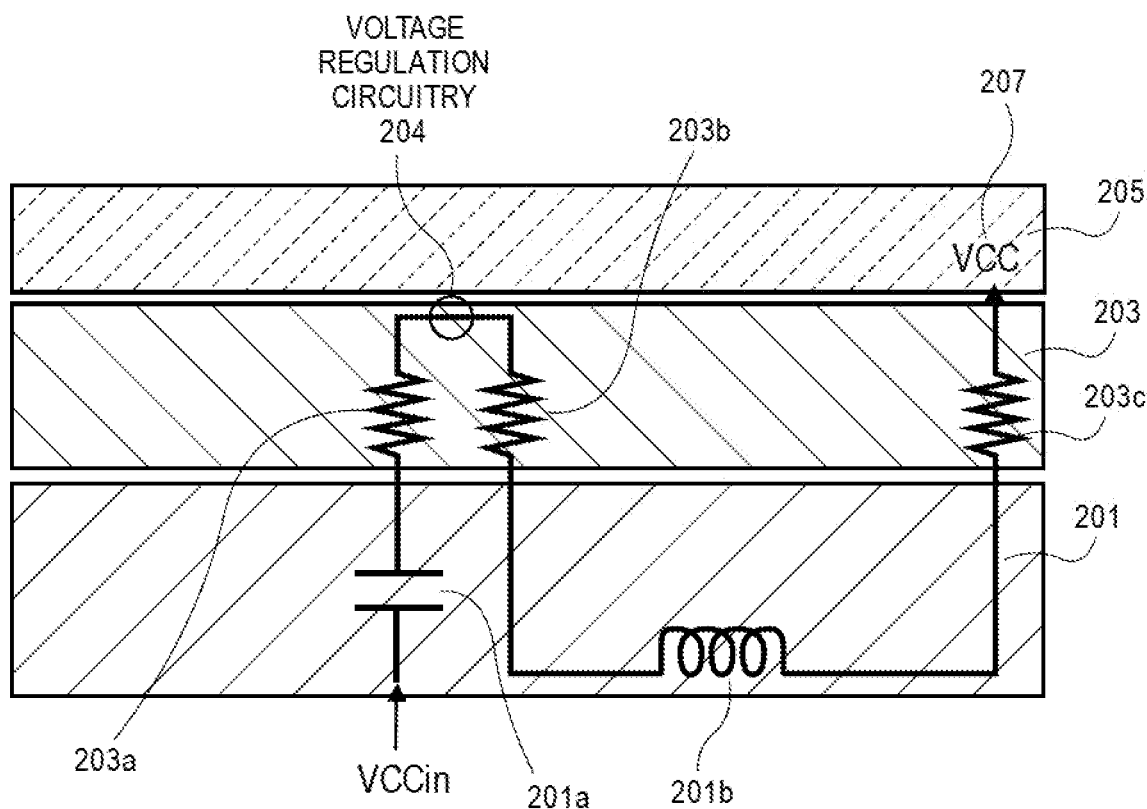
FIG. 2 is an illustration of power delivery circuitry of a previous approach.

FIG. 2 is an illustration of power delivery circuitry of a previous approach. FIG. 2 shows package substrate 201, base die 203, voltage regulation circuitry 204 and chiplet die 205.

Referring to FIG. 2, the chiplet die 205 (e.g., chiplets 103a-103f in FIG. 1) is positioned above the base die 203. In an embodiment, the chiplet die 205 can include a CPU. In other embodiments, the chiplet die 205 can include other types of devices.

The base die 203 is located in the base die layer of the die complex and includes on-die voltage regulator circuitry. The base die 203 is positioned above the package substrate 201. In an embodiment, the package substrate 201 includes an on-package capacitor 201a and an on-package inductor 201b. In the FIG. 2 example, the on-die voltage regulator circuitry includes TSV 203a, TSV 203b and TSV 203c. The TSV 203a is coupled to the on-package capacitor 201a that is located in the package substrate 201 and the TSV 203b that is located in the base die 203. The TSV 203a receives power from the on-package capacitor 201a and provides power through the TSV 203a to the voltage regulation circuitry 204. The TSV 203b is coupled to the TSV 203a that is located in the base die 203 and the inductor 201b that is located in the package substrate 201. The TSV 203b receives power from the TSV 203a and provides power to the inductor 201b. The TSV 203c is coupled to the inductor 201b that is located in the package substrate and the chiplet power terminal 207. The TSV 203 receives power from the inductor 201b and provides power to the chiplet power terminal 207 that is used to power the chiplet die 205.

Referring to FIG. 2, on-die voltage regulator power delivery to the chiplet die 205 involves three TSV paths (e.g., paths provided by TSVs 203a-203c) through the base die 203. Initially, power is supplied through a first TSV path (e.g., TSV 203a) to on-die voltage regulator circuitry in the base die 203. Then, the output power passes through a second TSV path (e.g., TV 203b) to reach the on-package inductor 201b that is used for power out noise reduction. Thereafter, the inductor output power flows through the base die 203 a third time, through a third TSV path (e.g., TSV 203c), to reach the chiplet die 205.

A significant disadvantage of the approach of FIG. 2, as suggested above, is that the on-die voltage regulator power delivery path passes through the bulk silicon of the base die 203 an excessive number of times because of the use of package based inductors for power output noise reduction. This path is highly resistive and inefficient in that it requires space to be reserved in the package for capacitors and inductors.

Figure 3:
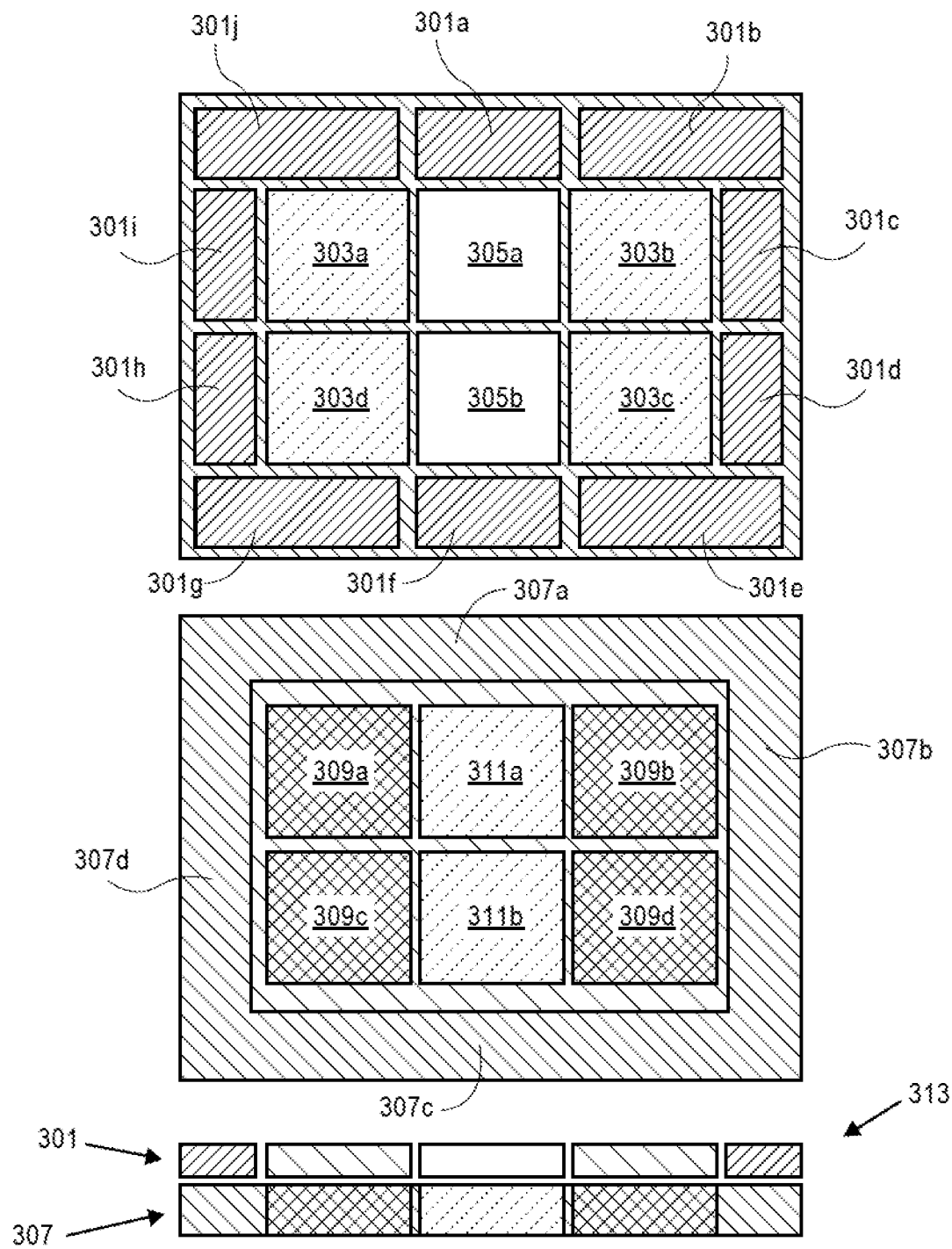
FIG. 3 is an illustration of a die package floor plan according to an embodiment.

FIG. 3 is an illustration of a die package floor plan 300 according to an embodiment. FIG. 3 shows passive components 301a-301j, chiplets 303a-303d, magnetic inductor array (MIA) 305a, MIA 305b, high speed I/O locations in the base die 307a-307d, cache locations in the base die 309a-309d, on-die voltage regulator locations on the base die 311a-311b.

Referring to FIG. 3, passive components 301a-301j are positioned above the high speed I/O interface die 307a-307d of the base die layer 307. The passive components 301a-301j can include components such as inductors and capacitors in contrast to the dummy silicon that is used in previous approaches (see FIG. 1).

The chiplets 303a-303d are small sized semiconductor chips that contain electrical circuitry. The chiplets 303a-303d include a first column of chiplets positioned adjacent a first side of a column of die that includes MIA die 305a and MIA die 305b and a second column of chiplets positioned adjacent a second side of the column of die that includes MIA die 305a and MIA die 305b. The chiplets 303a-303d can have a variety of functions. In an embodiment, the chiplets 303a-303d can include CPUs. In other embodiments, the chiplets 303a-303d can include other types of components.

The MIA die 305a and MIA die 305b are magnetic inductor array die that include on-die magnetic based inductors. The MIA die 305a and MIA die 305b are positioned between the chiplets 303a and 303d and the chiplets 303b and 303c. The MIA die 305a and the MIA die 305b are positioned above the on-die voltage regulator location in the base die 311a and the on-die voltage regulator location in the base die 311b. The on-die voltage regulator location 311a and the on-die voltage regulator location 311b are located on the base die layer 307 of the multilevel die complex.

The high speed I/O interface locations 307a-307d include high speed input and output circuitry that receives data for input to the die of the die complex and facilitates the transmission of data that is output from the die of the die complex. The high speed I/O interface locations 307a-307d are located at the periphery of the base die layer 307.

The cache locations 309a-309d store data that can be quickly accessed by chiplets 303a-303d. In an embodiment, the cache locations 309a-309d are positioned directly underneath the chiplets 303a-303d to facilitate the accessibility of the stored data. In an embodiment, the cache die 309a-309d can include first and second columns of die that are positioned on each side of on-die voltage regulator die 311a and 311b.

The on-die voltage regulator location 311a and the on-die voltage regulator location 311b include fully integrated voltage regulators and are a part of the base die layer 307 of the die complex. The on-die voltage regulator location 311a and the on-die voltage regulator location 311b can be independently programmable for optimal operation and to minimize power consumption. The on-die voltage regulator 311a and the on-die voltage regulator 311b are arranged in a single column and are located directly underneath the MIA die 305a and the MIA die 305b that are in the top die level 301 of the die complex.

Referring again to FIG. 3, a cross-sectional view 313 of the die complex is shown at bottom. The cross-sectional view shows the position of the passive components (e.g., 301a-301j) of the top die layer 301 above the high speed I/O interface locations (e.g., 307a-307d) of the base die layer 307 and the chiplets (e.g., 303a-303d) of the top die layer 301 above the cache locations (e.g., 309a-309d) of the base die layer 307. In an embodiment, the base die layer 307 can include a single base die that includes different circuit functions (e.g., voltage regulation, cache, high-speed IO). In other embodiments, the based die layer 307 can include a plurality of die. In addition, the cross-sectional view shows the MIA die (e.g., 305a and 305b) of the top die layer 301 above the on-die voltage regulator locations (e.g., 311a and 311b) of the base die layer 307.

Figure 4:
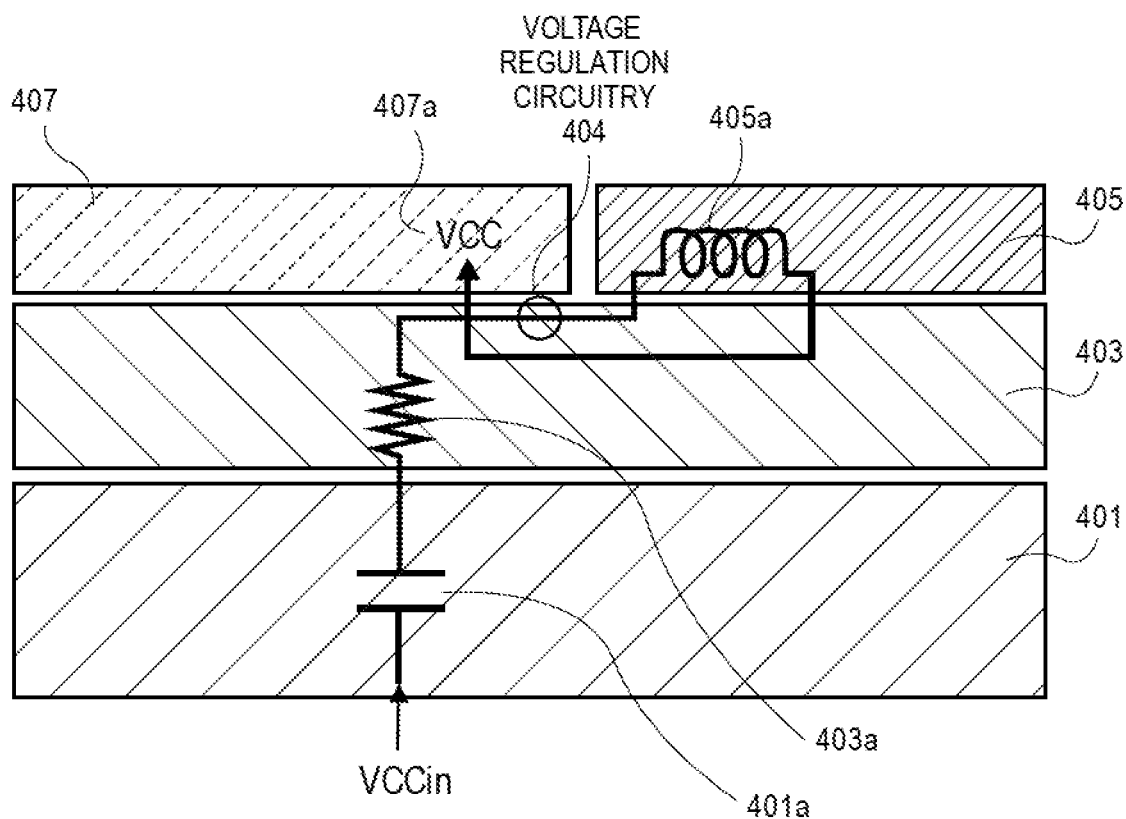
FIG. 4 is an illustration of the power delivery circuitry of a die package according to an embodiment.

In embodiments, the integration of silicon or organic based discrete passive components on top of a base die or dies (e.g., base die 307) is enabled. In conventional approaches, there are no active silicon dies located on top of the base die or dies (see FIG. 1) that are positioned above the high speed I/O base die locations (e.g., high speed I/O die 307a-307d). In an embodiment, the passive components can include but are not limited to inductors, on-die capacitors, filters or a combination of these components. Embodiments provide an alternative approach for improving power delivery decoupling, filtering and passive equalization for high speed input-output/RF FIG. 4 is an illustration of the power delivery circuitry of a die package according to an embodiment. FIG. 4 shows package substrate 401, on-package capacitor 401a, base die 403, TSV 403a, voltage regulation circuitry 404, passive component die 405, discrete inductor/thermal conductor 405a and chiplet 407.

Referring to FIG. 4, the package substrate 401 supports the base die 403 and includes an on-package capacitor 401a. The base die 403 is a part of the base die layer of the die complex and includes on-die voltage regulator circuitry. In the FIG. 4 embodiment, the on-die voltage regulator circuitry includes the TSV 403a. The TSV 403a is coupled to the on-package capacitor 401a that is located in the package substrate 401 and to the inductor 405a that is located in the passive component die 405. The TSV 403a receives power from the on-package capacitor 401a and provides power to the voltage regulation circuitry 404 on die 403. The inductor 405a receives power from the voltage regulation circuitry 404 on die 403 and provides power to the chiplet power terminal 407a.

The passive component die 405 and the chiplet die 407 are mounted on the top surface of the base die 403. The passive component die 405 includes the discrete inductor 405a and acts as a thermally conductive path to the system level heat removal solution. In an embodiment, the chiplet die 407 includes a CPU. In other embodiments, the chiplet die 407 can include other types of devices and/or components. The chiplet die 407 is powered by VCC 407a.

In FIG. 4, the dummy silicon of the FIG. 1 approach is replaced with passive dies that include magnetic array inductors that are formed from high quality inductors that are patterned from magnetic material such as cobalt or nickel and supplemental capacitance from on-die capacitors also patterned on the passive die (see FIG. 3). This approach improves the on-die voltage regulator power delivery by reducing the TSV paths from three to one and eliminating the need for on-package inductor solutions for output power noise reduction (see FIG. 4).

Figure 5:
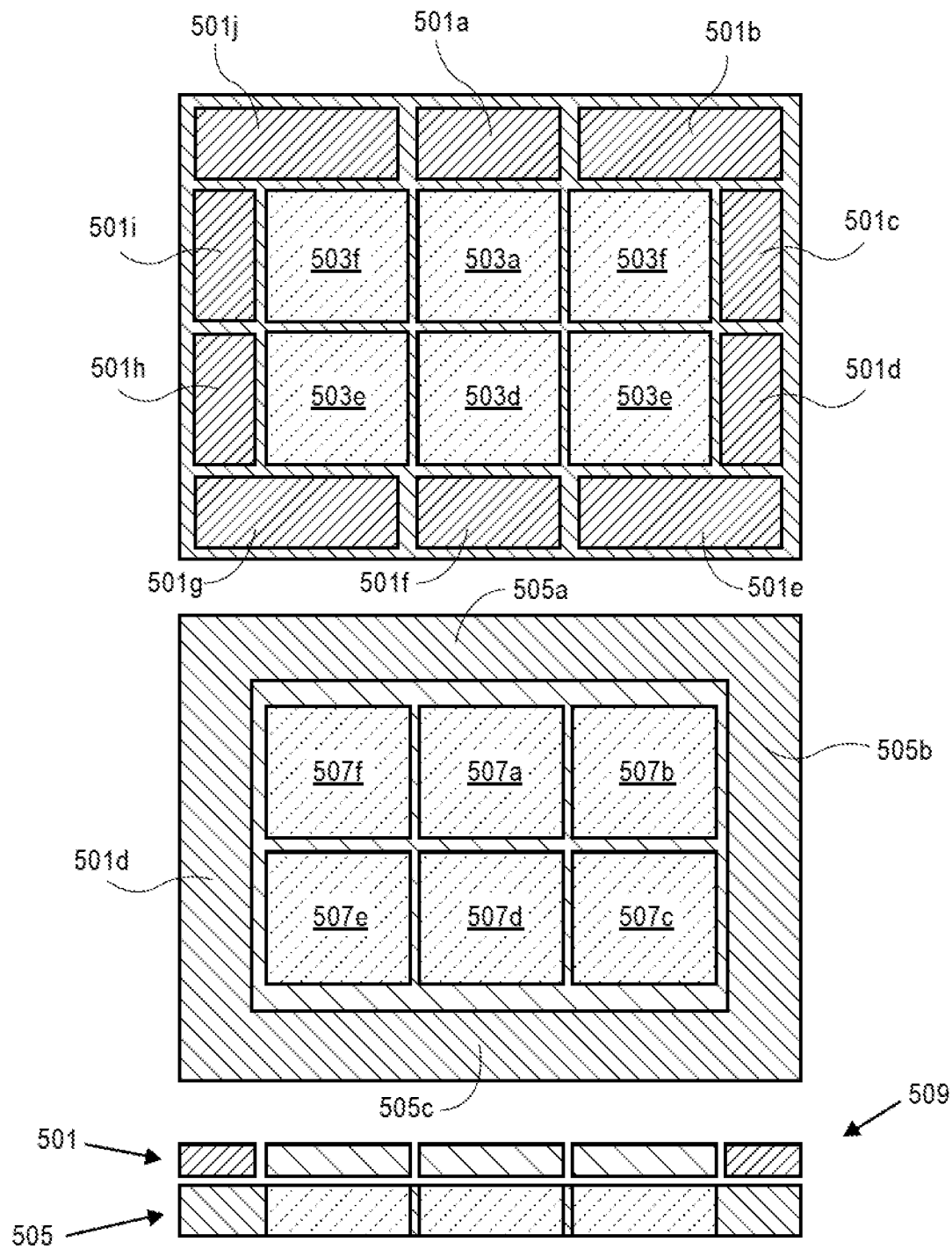
FIG. 5 is an illustration of a die package floor plan according to an embodiment.

FIG. 5 is an illustration of a die package floor plan 500 according to an embodiment. FIG. 5 shows passive component die 501a-501j, chiplets 503a-503f, high-speed I/O interface die 505a-505d and on-die voltage regulator die 507a-507f.

Referring to FIG. 5, passive component die 501a-501j are positioned above the periphery of the base die layer 505. In particular, the passive component die 501a-501j are positioned above the high speed I/O interface locations 505a-505d of the base die layer 505. The passive component die 501a-501j are used to support high speed signaling operations of the high speed I/O interface locations 505a-505d.

The chiplets 503a-503f are small sized semiconductor chips that contain electrical circuitry. The chiplets 503a-503f are organized in a plurality of rows and columns and are surrounded by passive component die 501a-501j. The chiplets 503a-503f can have a variety of functions.

The high speed I/O interface locations 505a-505d in the base die include high speed input and output circuitry that receives data for input to die of the die complex and facilitates the transmission of data that is output from the die of the die complex. The high speed I/O interface locations 505a-505d are positioned around the periphery of the base die layer 505.

On-die voltage regulator locations 507a-507f include fully integrated voltage regulators and are a part of the base die layer 505 of the die. The on-die voltage regulator locations 507a-507f can be independently programmable for optimal operation and to minimize power consumption. The on-die voltage regulator locations 507a-507f are arranged in a plurality of rows and columns and located directly underneath the chiplets 503a-503f of the top die layer 501 of the die complex.

Referring again to FIG. 5, a cross-sectional view 509 of the die complex is shown at bottom. The cross-sectional view 509 shows the position of the passive component die (e.g., 501a-501j) of the top die layer 501 above the high speed I/O interface locations (e.g., 505a-505d) of the base die layer 505 and the chiplets (e.g., 503a-503f) of the top die layer 501 above the on-die voltage regulator locations (e.g., 507a-507f) of the base die layer 505. In an embodiment, the base die layer 505 can include a single die that includes different circuit functions (e.g., voltage regulation, high-speed IO). In other embodiments, the base die layer 505 can include a plurality of die.

In an embodiment, providing on-die capacitors on the passive component die 501a-501j above the high speed I/O interface die 505a-505d improves performance without impacting space on the base die layer 505. For the high speed 110 interface die 505a-505d, the passive components can integrate silicon-based on-die capacitors with one or more on-die capacitor layers for greater capacity as compared to relying on a single on-die capacitor layer on the bottom die.

Figure 6:
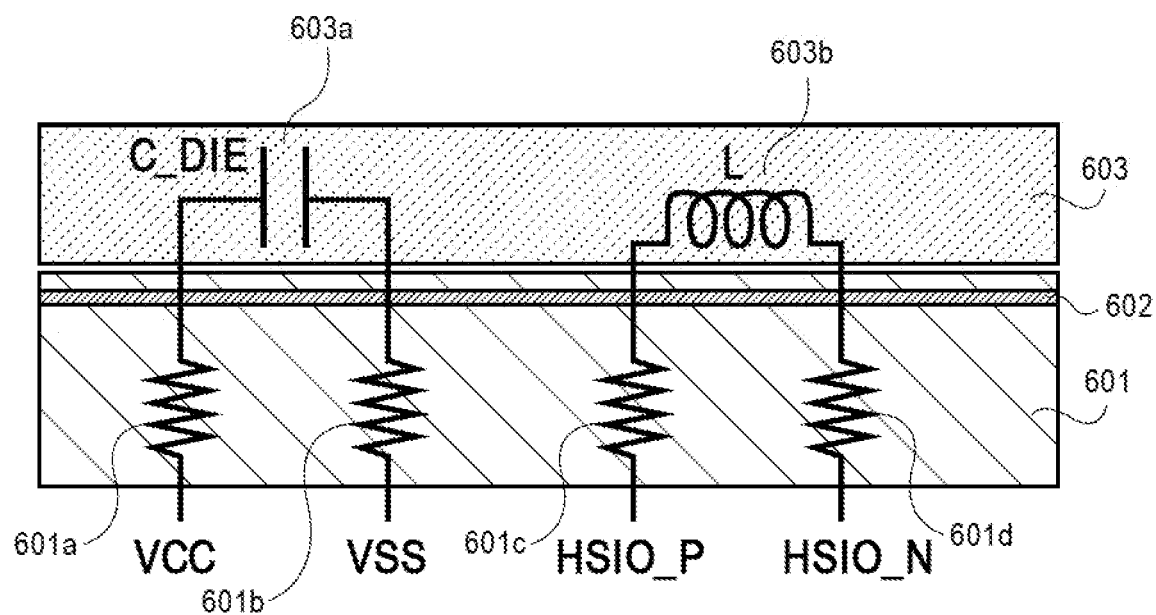
FIG. 6 is an illustration of power delivery circuitry of a die package according to an embodiment.

FIG. 6 is an illustration of aspects of the power delivery circuitry of a die package such as that shown in FIG. 5 according to an embodiment. FIG. 6 shows base die 601, TSV 601a-TSV 601d, active circuit layer 602, passive component die 603, capacitor 603a and inductor 603b.

Referring to FIG. 6, the base die 601 includes fully integrated voltage regulator circuitry TSV 601a-TSV 601d. TSV 601a receives power from power supply VCC and provides power to the capacitor 603a. The capacitor 603a receives power from TSV 601a and provides power to the active circuit layer 602 on 601. TSV 601b provides the return path for that current flow. TSV 601c provides a path from the active circuit layer 602 to package/system level connections for the positive high speed I/O differential signal HSIO_P of differential pair HSIO_P and HSIO_N. TSV 601d provides a path from the active circuit to package/system level connections for the negative high speed I/O differential signal HSIO_N of differential pair HSIO_P and HSIO_N. In an embodiment, the differential pair HSIO_P and HSIO_N are connected through a filtration inductor 603b that is patterned on top mount passive component die 603 to reduce differential pair positive to negative noise.

The passive component die 603 includes the capacitor 603*a* and the inductor 603*b*. The passive component die 603 is positioned above the high speed I/O interface locations (e.g., 505*a*-505*d* in FIG. 5) on the base die layer (e.g., 501 in FIG. 5).

Referring to FIG. 6, removing high speed I/O inductors from the base die circuit design provides the designers with the flexibility to fine-tune the fabrication process of the top die for optimal inductor performance. This approach can be used alongside approaches that provide additional on-die capacitor capacity to enable the high speed I/O to meet specifications that continue to tighten as data rates increase. For RF circuits on the base die, the passive component can also be silicon-based, organic-based, or other discrete inductor types which can be used for filtering or equalization purposes.

Figure 7:
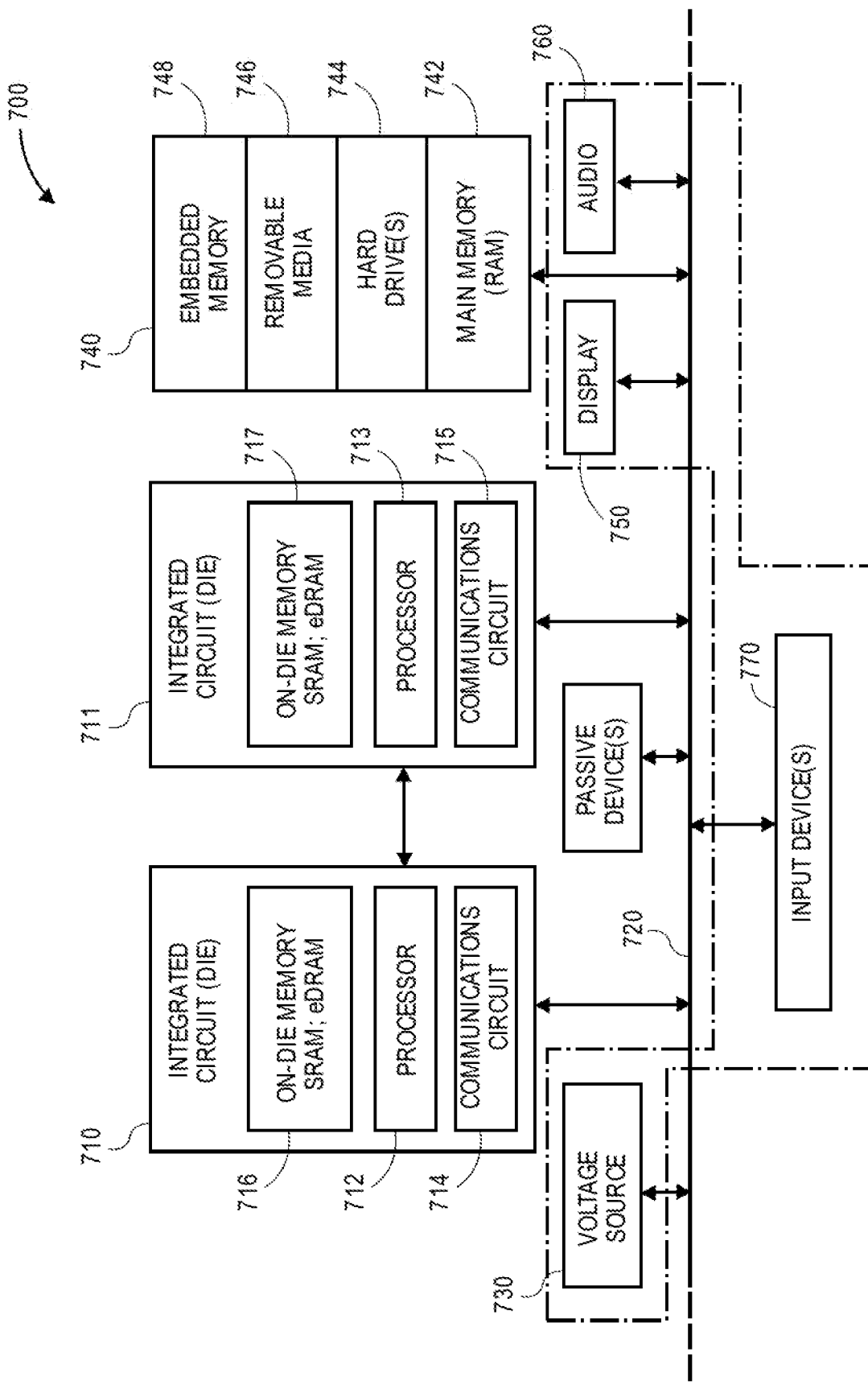
FIG. 7 is an illustration of a computer system in accordance with an embodiment of the present invention.

In a previous approach, if high speed I/O interfaces require higher on die capacitance to address high frequency noise, additional die area can be required to accommodate the increased capacitance. Package based capacitors can be used to address high frequency noise but are not as effective as on die capacitance. If such deficiencies are not addressed, the performance of the high speed I/O interface will be negatively impacted. It should be appreciated that high speed I/O interfaces are reliant on a large number of inductors. In a previous approach, for RF or high speed signaling applications, passive inductor components can be either patterned in a die area that is reserved on the silicon of the base die or integrated into the package substrate. In cases where the inductors are formed on the base die, they take up thick metal layer space that could otherwise be used to improve power distribution. Silicon based inductors formed in the base die also cause bump depopulation which can create problems as it relates to the back-end die fabrication process FIG. 7 is a schematic of a computer system 700, in accordance with an embodiment of the present invention. The computer system 700 (also referred to as the electronic system 700) as depicted can embody the die complex with integrated passive components, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a die complex with integrated passive components, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having the die complex with integrated passive components, according to any of the several disclosed embodiments and their equivalents, an electronic system, a computer system, one or more methods of fabricating an integrated circuit, and one or more methods of fabricating an electronic assembly that includes a package substrate having the die complex with integrated passive components, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having the die complex with integrated passive components embodiments and their equivalents. A foundation substrate may be included, as represented by the dashed line of FIG. 7. Passive devices may also be included, as is also depicted in FIG. 7.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A package that includes a bottom die. The bottom die includes voltage regulating circuitry, and input and output (I/O) circuitry surrounding the voltage regulating circuitry. The package also includes a top set of dies. The top set of dies includes a plurality of dies that include logic circuitry, and a plurality of dies that include passive components surrounding the plurality of dies that include logic circuitry. The plurality of dies that include passive components are coupled to the logic circuitry and to the voltage regulating circuitry.

Example Embodiment 2

The package of example embodiment 1, further comprising a package substrate wherein the bottom die is mounted on the package substrate.

Example Embodiment 3

The package of example embodiment 1, wherein the plurality of dies that include passive components are positioned above the bottom die I/O circuitry.

Example Embodiment 4

The package of example embodiment 1, wherein the voltage regulating circuitry includes fully integrated voltage regulators.

Example Embodiment 5

The package of example embodiment 1, wherein the logic circuitry includes a CPU.

Example Embodiment 6

The package of example embodiment 1, wherein the voltage regulating circuitry includes one through silicon via.

Example Embodiment 7

The package of example embodiment 1, 2, 3, 4, 5, or 6 wherein the voltage regulating circuitry provides power to the logic circuitry through an inductor.

Example Embodiment 8

The package of example embodiment 2, wherein the voltage regulating circuitry receives power from an on-package capacitor in the package substrate.

Example Embodiment 9

A package that includes a base die. The base die includes voltage regulating circuitry and cache circuitry adjacent to the voltage regulating circuitry. The base die also includes I/O circuitry surrounding the voltage regulating circuitry. In addition, the package includes a top set of dies. The top set of dies includes a plurality of dies that include first logic circuitry, a plurality of dies that include inductor arrays, and a plurality of dies that include passive components surrounding the plurality of dies that include logic circuitry and the plurality of dies that include inductor arrays. The plurality of dies that include passive components is coupled to the logic circuitry and to the voltage regulating circuitry.

Example Embodiment 10

The package of example embodiment 9, further comprising a package substrate wherein the bottom die is mounted on the package substrate. Example embodiment 11: The package of example embodiment 9, wherein the plurality of dies that include passive components are positioned above the I/O circuitry.

Example Embodiment 12

The package of example embodiment 9, wherein the passive components include at least one inductor and at least one capacitor.

Example Embodiment 13

The package of example embodiment 9, wherein the voltage regulating circuitry includes fully integrated voltage regulators.

Example Embodiment 14

The package of example embodiment 9, wherein the first logic circuitry includes a CPU.

Example Embodiment 15

The package of example embodiment 9, wherein the dies that include inductor arrays are formed above the die that includes fully integrated voltage regulating circuitry.

Example Embodiment 16

The package of example embodiment 9, 10, 11, 12, 13, 14 or 15 wherein the voltage regulating circuitry includes a plurality of through silicon vias.

Example Embodiment 17

A package includes a base die. The base die includes voltage regulating circuitry, and input and output (I/O)

circuitry surrounding the voltage regulating circuitry. The package also includes a top set of dies. The top set of dies includes a plurality of dies that include logic circuitry and a plurality of dies that include passive components surrounding the plurality of dies that include logic circuitry. The plurality of dies that include passive components is coupled to the logic circuitry and to the voltage regulating circuitry. The package further includes a package substrate underneath the bottom die that includes an on-package capacitor and/or inductor.

Example Embodiment 18

The package of example embodiment 17, wherein the base die is mounted on the package substrate.

Example Embodiment 19

The package of example embodiment 17, wherein the plurality of dies that include passive components are positioned above the die that includes I/O circuitry.

Example Embodiment 20

The package of embodiment 17, 18 or 19 wherein the voltage regulating circuitry includes fully integrated voltage regulators.

What is claimed is:

1. A package, comprising:
   a base die comprising:
      voltage regulating circuitry; and
      input and output (I/O) circuitry surrounding the voltage regulating circuitry; and
   a top set of dies comprising:
      a die that includes logic circuitry; and
      a plurality of dies that include passive components surrounding the die that includes logic circuitry, the plurality of dies that include passive components comprising inductor arrays coupled to the logic circuitry and to the voltage regulating circuitry, wherein at least a portion of one or more of the plurality of dies that include passive components is outside of a footprint of the voltage regulating circuitry of the base die.

2. The package of claim 1, further comprising a package substrate wherein the base die is mounted on the package substrate.

3. The package of claim 1, wherein the plurality of dies that include passive components are positioned above the base die I/O circuitry.

4. The package of claim 1, wherein the voltage regulating circuitry includes fully integrated voltage regulators.

5. The package of claim 1, wherein the logic circuitry includes a CPU.

6. The package of claim 1, wherein the voltage regulating circuitry includes one through silicon via.

7. The package of claim 1, wherein the voltage regulating circuitry provides power to the logic circuitry through an inductor.

8. The package of claim 2, wherein the voltage regulating circuitry receives power from an on-package capacitor in the package substrate.

9. A package, comprising:
   a base die comprising:
      voltage regulating circuitry;
      cache circuitry adjacent to the voltage regulating circuitry; and
      I/O circuitry surrounding the voltage regulating circuitry; and
   a top set of dies comprising:
      a plurality of dies that include logic circuitry;
      a plurality of dies that include inductor arrays; and
      a plurality of dies that include passive components surrounding the plurality of dies that include logic circuitry and the plurality of dies that include inductor arrays, the plurality of dies that include inductor arrays coupled to the logic circuitry and to the voltage regulating circuitry.

10. The package of claim 9, further comprising a package substrate wherein the bottom die is mounted on the package substrate.

11. The package of claim 9, wherein the plurality of dies that include passive components are positioned above the I/O circuitry.

12. The package of claim 9, wherein the passive components include at least one inductor and at least one capacitor.

13. The package of claim 9, wherein the voltage regulating circuitry includes fully integrated voltage regulators.

14. The package of claim 9, wherein the first logic circuitry includes a CPU.

15. The package of claim 9, wherein the dies that include inductor arrays are formed above the fully integrated voltage regulating circuitry.

16. The package of claim 9, wherein the voltage regulating circuitry includes a plurality of through silicon vias.

17. A package, comprising:
   a base die comprising:
      voltage regulating circuitry; and
      input and output (I/O) circuitry surrounding the voltage regulating circuitry;
   a top set of dies comprising:
      a die that includes logic circuitry; and
      a plurality of dies that include passive components surrounding the die that includes logic circuitry, the plurality of dies that include passive components comprising inductor arrays coupled to the logic circuitry and to the voltage regulating circuitry, wherein at least a portion of one or more of the plurality of dies that include passive components is outside of a footprint of the voltage regulating circuitry of the base die; and
   a package substrate underneath the bottom set of dies that includes an on-package capacitor.

18. The package of claim 17, wherein the base die is mounted on the package substrate.

19. The package of claim 17, wherein the plurality of dies that include passive components are positioned above the I/O circuitry.

20. The package of claim 17, wherein the voltage regulating circuitry includes fully integrated voltage regulators.

* * * * *